(12) United States Patent
Rhodes

(10) Patent No.: US 7,375,026 B2
(45) Date of Patent: May 20, 2008

(54) LOCAL MULTILAYERED METALLIZATION

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 129 days.

(21) Appl. No.: 10/931,357

(22) Filed: Aug. 31, 2004

(65) Prior Publication Data
US 2005/0074966 A1    Apr. 7, 2005

Related U.S. Application Data

(62) Division of application No. 09/388,567, filed on Sep. 2, 1999.

(51) Int. Cl.
*H01L 21/4763* (2006.01)

(52) U.S. Cl. .................. 438/637; 438/653; 438/687

(58) Field of Classification Search ........ 438/612, 438/617, 622, 626, 627, 629, 633, 637, 638, 438/639, 643, 653, 687
See application file for complete search history.

(56) References Cited

U.S. PATENT DOCUMENTS

| | | | |
|---|---|---|---|
| 5,231,053 A | 7/1993 | Bost et al. | |
| 5,231,607 A | 7/1993 | Yoshida et al. | |
| 5,357,136 A | 10/1994 | Yoshioka | |
| 5,365,112 A | 11/1994 | Ohshima | 257/784 |
| 5,368,880 A | 11/1994 | McKee et al. | 427/125 |
| 5,444,018 A | 8/1995 | Yost et al. | 437/190 |
| 5,659,201 A | 8/1997 | Wollesen | |
| 5,738,917 A | 4/1998 | Besser et al. | 427/576 |
| 5,785,236 A | 7/1998 | Cheung et al. | |
| 5,918,149 A | 6/1999 | Besser et al. | |
| 5,933,364 A | 8/1999 | Aoyama et al. | |
| 5,936,283 A | 8/1999 | Narita et al. | |
| 5,943,254 A | 8/1999 | Bakeman, Jr. et al. | |
| 5,943,285 A | 8/1999 | Kohno | |
| 5,956,612 A | 9/1999 | Elliott et al. | |
| 5,978,623 A | 11/1999 | Itoh | |
| 5,981,386 A | 11/1999 | Ho et al. | 438/672 |
| 6,069,066 A * | 5/2000 | Huang et al. | 438/612 |
| 6,080,656 A | 6/2000 | Shih et al. | 438/626 |

(Continued)

OTHER PUBLICATIONS

Applicant's response to action mailed Feb. 2, 2007 in U.S. Appl. No. 09/388,567, 18 pages.

(Continued)

*Primary Examiner*—Kevin M. Picardat
(74) *Attorney, Agent, or Firm*—Schwegman, Lundberg & Woessner, P.A.

(57) ABSTRACT

An interconnect comprises a trench and a number of metal layers above the trench. The trench has a depth and a width. The depth is greater than a critical depth, and the number of metal layers is a function of the width. In an alternate embodiment, a metallization structure having a trench including a metal layer and a second trench including a plurality of metal layers coupled to the metal layer is disclosed. The metal layer is highly conductive, and at least one of the plurality of metal layers is a metal layer that is capable of being reliably wire-bonded to a gold wire. The trench is narrower than the second trench, and at least one of the plurality of metal layers is copper or a copper alloy.

26 Claims, 7 Drawing Sheets

U.S. PATENT DOCUMENTS

| | | | |
|---|---|---|---|
| 6,093,966 A | 7/2000 | Venkatraman et al. | 257/751 |
| 6,118,699 A | 9/2000 | Tatsumi et al. | |
| 6,147,404 A | 11/2000 | Pramanick et al. | |
| 6,150,687 A | 11/2000 | Noble et al. | 257/302 |
| 6,174,804 B1 | 1/2001 | Hsu | 438/638 |
| 6,191,023 B1 | 2/2001 | Chen | |
| 6,207,547 B1 | 3/2001 | Chittipeddi et al. | |
| 6,208,547 B1 | 3/2001 | Ooishi | |
| 6,218,302 B1 * | 4/2001 | Braeckelmann et al. | 438/637 |
| 6,245,380 B1 | 6/2001 | Sun et al. | 427/97 |
| 6,255,151 B1 | 7/2001 | Fukuda et al. | |
| 6,255,216 B1 | 7/2001 | Doan et al. | |
| 6,258,707 B1 | 7/2001 | Uzoh | |
| 6,274,923 B1 | 8/2001 | Mikagi | 257/642 |
| 6,284,656 B1 | 9/2001 | Farrar | |
| 6,285,038 B1 | 9/2001 | Rhodes | |
| 6,303,492 B1 | 10/2001 | Rhodes et al. | |
| 6,348,731 B1 | 2/2002 | Ashley et al. | 257/751 |
| 6,351,028 B1 | 2/2002 | Akram | 257/686 |
| 6,404,053 B2 | 6/2002 | Givens | 257/751 |
| 6,413,858 B1 | 7/2002 | Chopra | |
| 6,449,707 B1 | 9/2002 | Gotou | |
| 6,541,858 B1 | 4/2003 | Farrar | |
| 6,551,916 B2 | 4/2003 | Lin et al. | 438/612 |
| 6,611,037 B1 | 8/2003 | Rhodes | |
| 6,833,623 B2 | 12/2004 | Leiphart | |
| 6,844,253 B2 | 1/2005 | Farrar | |
| 2001/0045654 A1 | 11/2001 | Givens | 257/758 |
| 2002/0022363 A1 | 2/2002 | Ritzdorf et al. | |
| 2002/0053689 A1 | 5/2002 | Forbes et al. | |
| 2002/0127845 A1 | 9/2002 | Farrar | |
| 2006/0199387 A1 | 9/2006 | Rhodes | |

OTHER PUBLICATIONS

Applicant's response to action mailed Mar. 23, 2005 in U.S. Appl. No. 09/388,567, 16 pages.

Applicant's response to action mailed May 24, 2004 in U.S. Appl. No. 09/388,567, 17 pages.

Applicant's response to action mailed Aug. 3, 2006 in U.S. Appl. No. 09/388,567, 18 pages.

Applicant's response to action mailed Sep. 11, 2002 in U.S. Appl. No. 09/388,567, 16 pages.

Applicant's response to action mailed Oct. 1, 2003 in U.S. Appl. No. 09/388,567, 18 pages.

Applicant's response to Final Action mailed Oct. 7, 2005 in U.S. Appl. No. 09/388,567, 27 pages.

Examiner's Final Office Action mailed Oct. 7, 2005 in U.S. Appl. No. 09/388,567, 10 pages.

Examiner's Non-Final Office Action mailed Feb. 2, 2007 in U.S. Appl. No. 09/388,567, 9 pages.

Examiner's Non-Final Office Action mailed Mar. 23, 2005 in U.S. Appl. No. 09/388,567, 10 pages.

Examiner's Non-Final Office Action mailed May 17, 2007 in U.S. Appl. No. 11/420,101, 9 pages.

Examiner's Non-Final Office Action mailed May 24, 2004 in U.S. Appl. No. 09/388,567, 11 pages.

Examiner's Non-Final Office Action mailed Aug. 3, 2006 in U.S. Appl. No. 09/388,567, 9 pages.

Examiner's Non-Final Office Action mailed Sep. 11, 2002 in U.S. Appl. No. 09/388,567, 10 pages.

Examiner's Non-Final Office Action mailed Oct. 1, 2003 in U.S. Appl. No. 09/388,567, 8 pages.

"U.S. Appl. No. 09-388567 Amendment and response filed Jan. 13, 2003 to Non Final office action mailed Sep. 11, 2002", 4 pgs.

"U.S. Appl. No. 09-388567 Amendment and response filed Dec. 7, 2005 to Final office action mailed Oct. 7, 2005", 18 pgs.

"U.S. Appl. No. 09-388567 Final office action mailed Oct. 7, 2005", 10 pgs.

"U.S. Appl. No. 09-388567 Non Final office action mailed Feb. 8, 2007", 9 pgs.

"U.S. Appl. No. 09-388567 Non Final office action mailed Mar. 23, 2005", 10 pgs.

"U.S. Appl. No. 09-388567 Non Final office action mailed May 24, 2004", 11 pgs.

"U.S. Appl. No. 09-388567 Non Final office action mailed Aug. 3, 2006", 9 pgs.

"U.S. Appl. No. 09-388567 Non Final office action mailed Sep. 11, 2002", 10 pgs.

"U.S. Appl. No. 09-388567 Non Final office action mailed Oct. 1, 2003", 8 pgs.

"U.S. Appl. No. 09-388567 Response filed Jan. 1, 2004 to Non Final office action mailed Oct. 1, 2003", 15 pgs.

"U.S. Appl. No. 09-388567 Response filed May 8, 2007 to Non Final office action mailed Feb. 8, 2007", 16 pgs.

"U.S. Appl. No. 09-388567 Response filed Jun. 23, 2005 to Non Final office action mailed Mar. 23, 2005", 14 pgs.

"U.S. Appl. No. 09-388567 Response filed Nov. 3, 2006 to Non Final office action mailed Aug. 8, 2006", 12 pgs.

"U.S. Appl. No. 09-388567 Response filed Nov. 24, 2004 to Non Final office action mailed May 24, 2004", 13 pgs.

"U.S. Appl. No. 11-420101 Non Final Office Action mailed May 17, 2007", 9 pgs.

* cited by examiner

LOCAL MULTILAYERED METALLIZATION

RELATED APPLICATIONS

This application is a Divisional of U.S. application Ser. No. 09/388,567, filed Sep. 2, 1999, which is incorporated herein by reference.

FIELD OF THE INVENTION

This invention relates to the field of integrated circuit manufacturing, and more particularly to metallization in integrated circuit manufacturing.

BACKGROUND OF THE INVENTION

Copper and copper alloys are often substituted for the more traditional aluminum and aluminum alloys as the primary signal and power carrying conductive structures in integrated circuits. Unfortunately, when copper and copper alloy pads are wire-bonded to a highly conductive wire, such as a gold, using current state-of-the-art wire-bonding processes, the resulting copper and gold bonds or copper alloy and gold bonds are not as reliable as aluminum and gold bonds or aluminum alloy and gold bonds used in the prior art.

One solution to this problem is shown in the prior art bonding structure 100 of FIG. 1. Bonding structure 100 includes substrate 103, copper conductor 106, dielectric layer 109, barrier layer 112, aluminum layer 115, passivation layer 116 and polyimide layer 118. To avoid wire-bonding to copper, dielectric layer 109 is etched at the location of copper conductor 106, and a barrier layer 112 of titanium or titanium nitride is deposited above copper conductor 106. Aluminum layer 115 is deposited above barrier layer 112, and passivation 116 and polyimide layers 118 are deposited above aluminum layer 115. Finally, passivation 116 and polyimide 118 layers are etched to expose aluminum layer 115 for wire-bonding. Unfortunately, this solution has several problems. First, it requires two extra masking operations that are not required when wire-bonding to an aluminum or an aluminum-copper conductor. It requires a masking operation to expose copper conductor 106 prior to depositing barrier layer 112 and aluminum layer 115, and it requires a masking operation to pattern aluminum layer 115, prior to wire-bonding. Second, the extra processing steps increase the complexity of the manufacturing operation and the failure rate of the manufactured circuits. Third, the solution is expensive, since it requires more materials, masking steps, and time than the prior art processes to manufacture the integrated circuit.

For these and other reasons there is a need for the present invention.

SUMMARY OF THE INVENTION

The above mentioned problems with integrated circuit metallization and other problems are addressed by the present invention and will be understood by reading and studying the following specification.

An interconnect comprising a trench and a number of metal layers above the trench is disclosed. The trench has a depth and a width. The depth is greater than a critical depth, and the number of metal layers is determined by the width.

In an alternate embodiment, a metallization structure having a trench including a metal layer and a second trench including a plurality of metal layers coupled to the metal layer is disclosed. The metal layer is highly conductive, and at least one of the plurality of metal layers is a metal layer that is capable of being reliably wire-bonded to a gold wire. The trench is narrower than the second trench, and at least one of the plurality of metal layers is copper or a copper alloy.

DETAILED DESCRIPTION OF THE PREFERRED EMBODIMENTS

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the appended claims.

Figure 1:
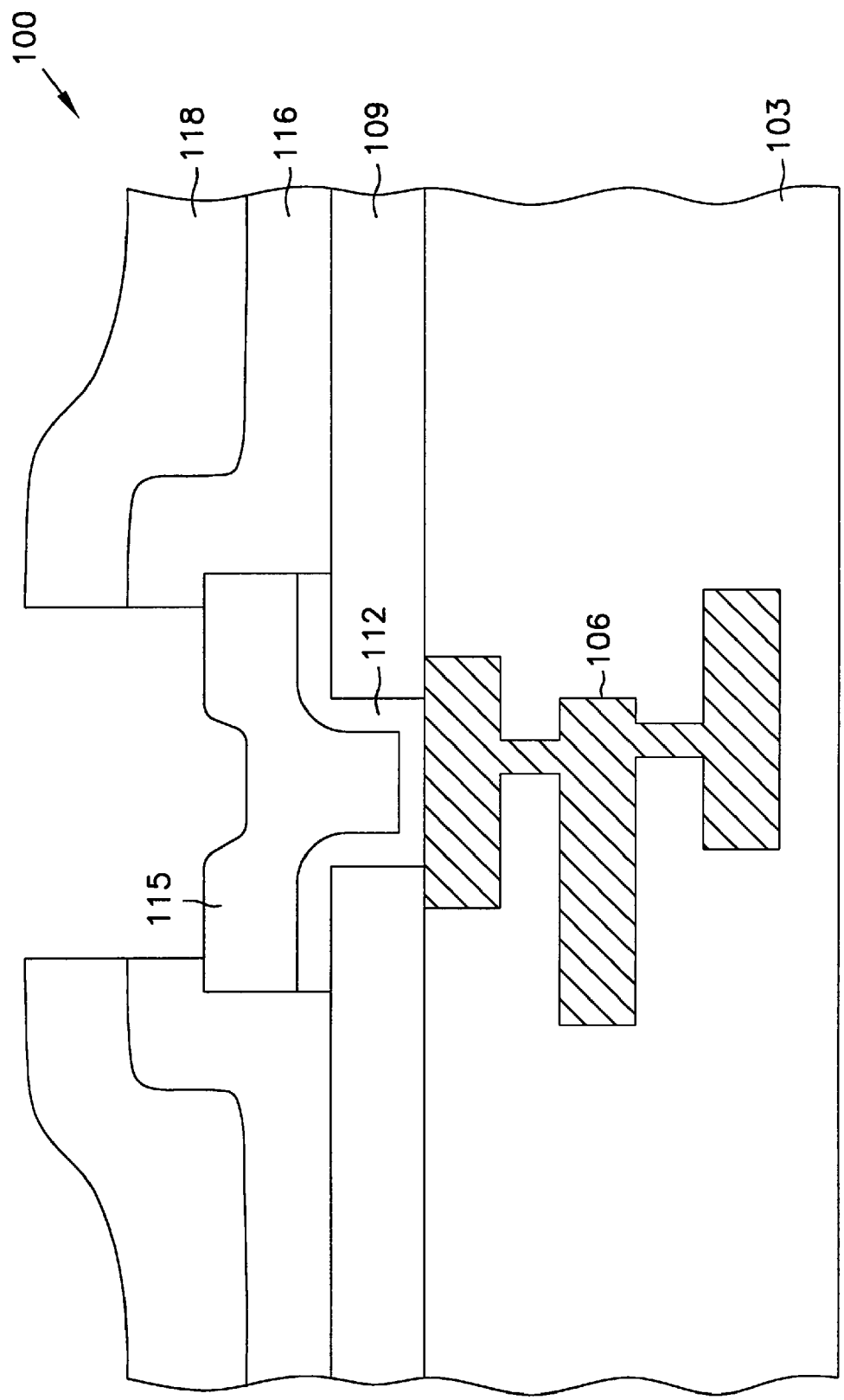
FIG. 1 is a cross-sectional side view of a prior art metallization bonding structure.
Figure 2:
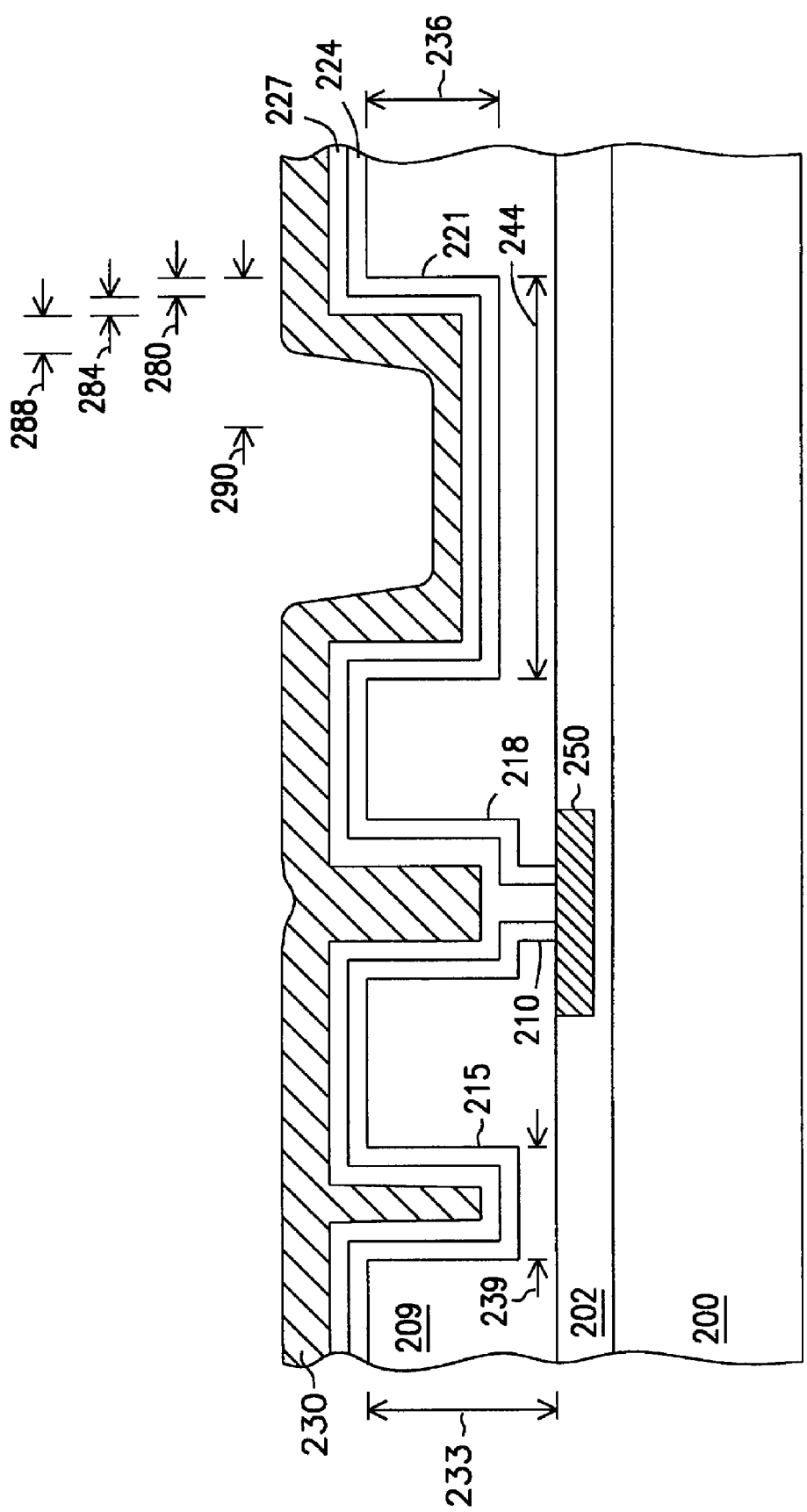
FIG. 2 is a cross-sectional side view of a substrate having trenches and barrier and copper metallization deposited on the substrate.

FIG. 2 is a cross-sectional side view of one embodiment of the invention. In the substrate 200 there will be various implants such as NWELLs, PWELLs, transistor implants, and source-drain implants that are, for simplicity, not shown. Over the substrate 200 may be formed transistor gates, polysilicon or tungsten plugs, and contact holes from the first layer of metallization down to these underlying layers and the silicon substrate. For simplicity, none of these details are shown as they are elements that are well known and may also be present. Over these structures and over the substrate 200 is shown an insulating layer 202. A conductive layer 250 is shown formed in insulating layer 202. Insulating layer 209 is deposited above conductive layer 250 and above the insulating layer 202. If the top surface defined by insulating layer 202 and conductive layer 250 is not globally planar, then the top surface of insulating layer 209 will need to be made globally planar by chemical mechanical polishing (CMP). Openings 210 (in the insulating layer 209) to the conductive layer 250 are formed by patterning and etching.

Next, trenches 215, 218, 221 are etched into the insulating layer. Barrier layer 224, seed layer 227, and copper layer 230 are then deposited into these trenches.

What is shown in FIG. 2 is a double damascene process in which both the opening 210 and the trenches 215, 218, 221 are patterning into the insulating layer 209 prior to depositing any metal layers. As is well known in the art, a single damascene process could have been shown. Trench 221 is the bonding pad trench.

Substrate 200 is a semiconductor, such as silicon or germanium, or other material, such as gallium arsenide or silicon-on-sapphire, suitable for use as a substrate in the fabrication of integrated circuits.

Insulating layer 209 is deposited above substrate 200. Insulating layer 209 blocks undesired current flow between the substrate 200 and the conductive layers above insulating layer 209. Insulating layer 209 additionally serves to block current flow between distinct conductive lines patterned into the insulating layer 209. Insulating layer 209 is not limited to a particular insulating material. In one embodiment, insulating layer 209 is an oxide, such as silicon oxide, fluorinated silicon oxide, or silicon dioxide. In an alternate embodiment, insulating layer 209 is a polymer, a foamed polymer, or polyimide. After insulating layer 209 is deposited on conductive layer 250 and insulating layer 202, the surface of insulating layer 209 may be planarized using a surface planarizing process, such as chemical mechanical polishing. This planarization of layer 209 is required if the top surface of the underlying insulating layer 202 and conductive layer 250 was not previously planarized. The insulating layer has a final thickness 233.

Trenches or depressions 215, 218, 221 are etched in insulating layer 209 and when filled with a conductive material are capable of functioning as electrical interconnects, signal carrying conductors, conductive structures, or connective structures coupling together integrated circuit elements, such as resistors, capacitors, and transistors, or coupling integrated circuit elements to bonding pads. These electrical interconnects are also suitable for use in connection with the fabrication of memory circuits or cells, logic circuits or cells, and analog circuits or cells. Trenches 215 and 218 are etched to dimensions suitable for a signal carrying conductor. All trenches 215, 218, 221 are etched to a depth 236. Signal carrying conductor filled trench 215 has a width 239 and a depth 236. Width 239 and depth 236 are selected to provide a particular resistance and capacitance for the conductor. Since the resistance of a conductor is inversely proportional to the cross-sectional area of conductor, the greater the depth 236 and width 239 of trench 215, the less the resistance of the conductor that fills the trenches.

The widths of trenches 215 and 218 are not limited to a particular value. For example, in one embodiment, trench 215 is etched to a width 239 that is less than the width 244 of bonding pad trench 221. Restricting the width of trenches 215 and 218 to a width that is less than the width of bonding pad trench 221 permits trenches 215 and 218 to overfill during a copper deposition process, while bonding pad trench 221 under fills.

Trench 221 is a bond pad. Trench 221, in one embodiment, is etched to dimensions sufficient for use in a wire-bonding operation, and trench 221 is etched to a width 244 that is greater than the width 239 of trench 215 and the width of trench 218.

Critical width 290, in one embodiment, is defined as twice the sum of the side wall barrier thickness 280, the sidewall seed thickness 284, and the sidewall copper thickness 288 (i.e., critical width 290, equals 2×[sidewall barrier thickness 280+sidewall seed thickness 284+sidewall copper thickness 288]).

The minimum trench width 239 is less than or equal to the critical width 290. The bond pad trench 244 is greater than the critical width 290.

Figure 3:
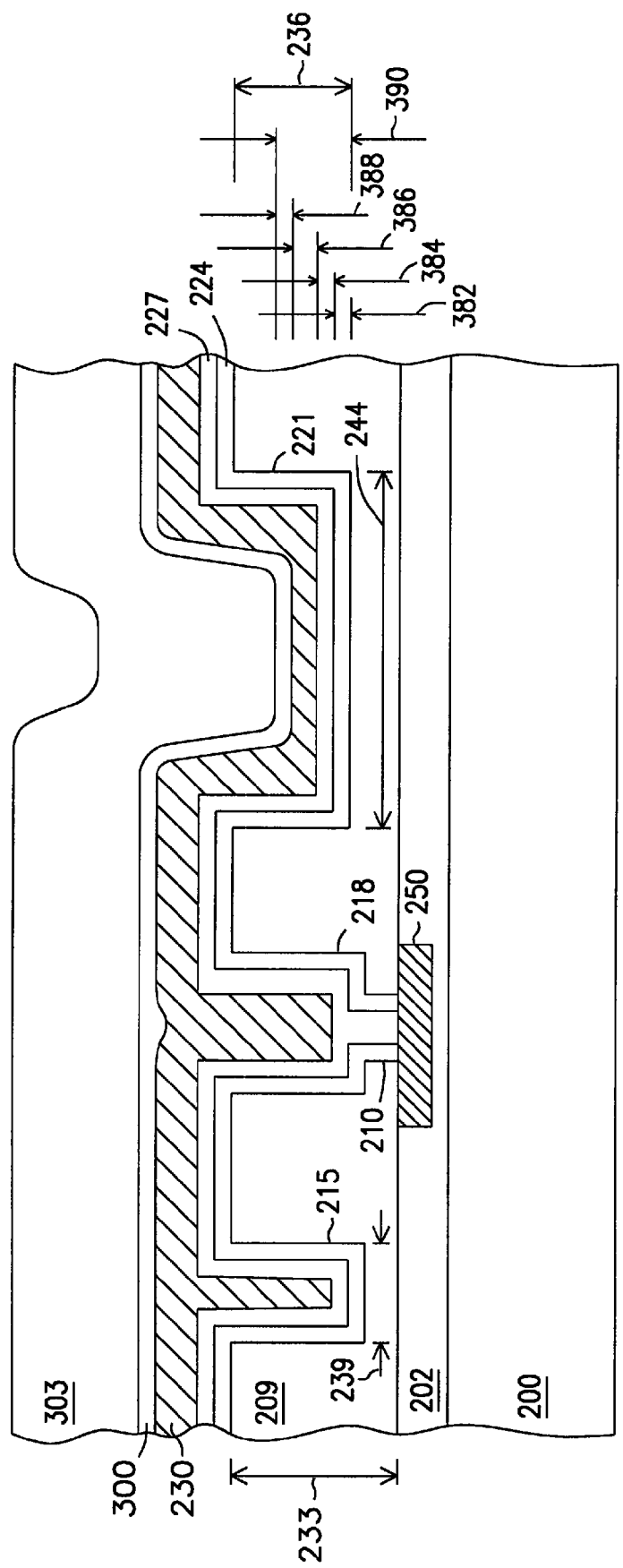
FIG. 3 is a cross-sectional side view of a substrate having a barrier layer and a conductive layer deposited above a copper layer on the substrate.
Figure 4:
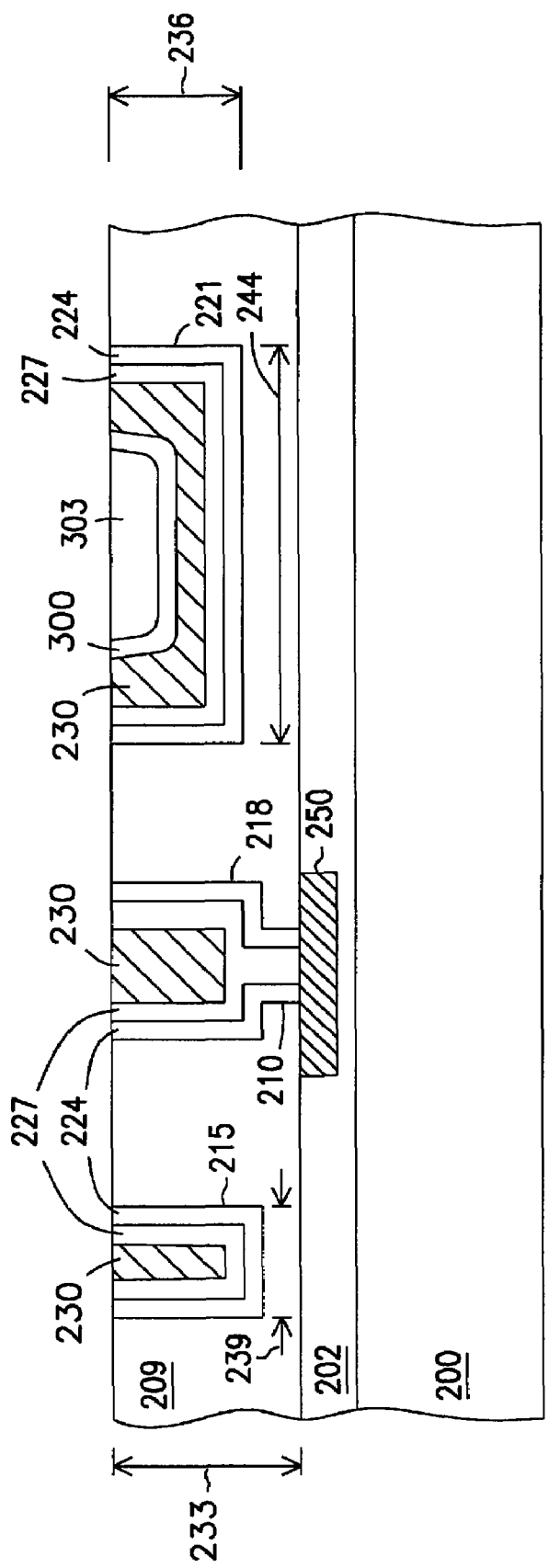
FIG. 4 is cross-sectional side view of a substrate having a filled bond pad trench and a filled signal carrying trench after chemical mechanical polishing.

The process flow shown in FIGS. 2, 3, and 4 is a dual damascene process. In this process the opening 210 and the trenches 215, 218, 221 are formed in the insulating layer 209. Then the metallization layers are deposited to simultaneously deposit into the opening 210 and the trenches 215, 218, 221. A variety of devices, such as memory cells, logic cells, capacitors, and transistors, can be interconnected using a dual damascene process with a copper interconnect.

Alternatively, a simple damascene process may be used. In the simple damascene process, openings are formed in an insulating layer down to a conducting layer. The opening is then filled with a conducting material such as Ti/TiN/W. This Ti/TiN/W deposition is removed from the surface of the insulating layer by dry etch, wet etch, or CMP to leave the Ti/TiN/W metal sandwich structure in the openings only. Next, another insulating layer is deposited and trenches are etched through this insulating layer, so that a trench exposes the top surface of the Ti/TiN/W metallization in an opening. The trenches are then deposited with a second metallization. After a subsequent metal dry etch or CMP, the damascene metallization in the trenches is formed.

Barrier layer 224 is deposited above insulating layer 209 to block the diffusion of copper into insulating layer 209. In one embodiment, barrier layer 224 is fabricated from titanium and titanium nitride. In an alternate embodiment, barrier layer 224 is fabricated from tantalum. In another alternate embodiment, barrier layer 224 is fabricated from tantalum nitride. In still another alternate embodiment, barrier layer 224 is fabricated from tantalum and tantalum nitride. Barrier layer 224 is deposited to a thickness of between about 50 and about 1000 angstroms. Forming a barrier layer 224 having a thickness of less than about 50 angstroms does not adequately block the flow of impurities into insulating layer 209. Forming barrier layer 224 with a thickness of more than about 1000 angstroms tends to leave insufficient space in trenches 215 and 218 for a conductive material. In the preferred embodiment, barrier layer 224 is formed from tantalum nitride deposited to a thickness of between about 100 and 500 angstroms. In the preferred embodiment, barrier layer 224 is deposited by chemical vapor deposition (CVD). Alternatively, barrier layer 224 is deposited by a physical vapor deposition technique, such as sputtering.

Seed layer 227, in one embodiment, is formed from a conductive material deposited on barrier layer 224 to provide a site for depositing a metal to form an integrated circuit interconnect. In an alternate embodiment, seed layer 227 is formed from copper. In another an alternate embodiment, seed layer 227 is formed from an alloy of copper, such as CuAl. Seed layer 227 is deposited by physical vapor deposition or chemical vapor deposition to a depth that is sufficient to support an electroplating deposition process. In one embodiment, a seed layer of copper is deposited to a depth of between about 100 and 1000 angstroms. In still another alternate embodiment of an interconnect, seed layer 227 is not formed, and copper layer 230 is formed above barrier layer 224.

Copper layer 230, in one embodiment, is formed above the barrier layer 224 and the seed layer 227. In one embodiment, copper layer 230 is fabricated from copper or an alloy of copper, such as CuAl. Copper layer 230 is deposited above the barrier layer 224 and the seed layer 227 to a depth that overfills trenches 215 and 218, while under filling bond pad trench 221. In the preferred embodiment, copper layer 230 is deposited by electroplating. In an alternate embodiment, copper or copper alloy is deposited by CVD or sputtering. The depth of the copper deposited in trenches 215, 218, 221 is controlled by adjusting the deposition process. In one embodiment, trenches 215 and 218 are filled or overfilled, while trench 221 is under filled to permit latter filling with a material suitable for eutectically bonding to a gold wire using state-of-the-art wire-bonding processes.

FIG. 3 is a cross-sectional side view of substrate 200 having a barrier layer 300 deposited above copper layer 230 and a conductive layer 303 deposited above barrier layer 300. Barrier layer 300 is fabricated from a material that blocks the migration of copper into conductive layer 303. In one embodiment, barrier layer 300 is fabricated from a material, such as a refractory metal, TiN, TaN, Ti/TiN, Ta/TaN, or Ti/TaN. Conductive layer 303 is fabricated from a material that is easily and reliably wire-bonded using state of the art wire-bonding processes. In one embodiment, conductive layer 303 is fabricated from aluminum. In an alternate embodiment, conductive layer 303 is fabricated from an alloy of aluminum, such as AlCu. Conductive layer 303 is deposited on barrier layer 300 to a depth that is sufficient to wire-bond to a gold wire.

As shown in FIG. 3, the vertical barrier thickness 382 is the thickness of the barrier layer 224 at the bottom of a wide trench such as the bond pad trench 221. The vertical seed thickness 384 is the thickness of the seed layer 227 at the bottom of a wide trench such as the bond pad trench 221. The vertical copper thickness 386 is the thickness of the copper layer 230 at the bottom of a wide trench such as the bond pad trench 221. The vertical barrier thickness 388 is the thickness of the barrier layer 300 at the bottom of a wide trench such as the bond pad trench 221.

Critical depth 390, in one embodiment, is defined as follows: Critical depth 390=the vertical barrier thickness 382+vertical seed thickness 384+vertical copper thickness 386+vertical barrier thickness 388.

The trench depth 236 must be greater than the critical depth 390.

FIG. 4 is cross-sectional side view of substrate 200 of FIG. 3 after chemical mechanical polishing (CMP). CMP removes unwanted layers of metal from the surface of insulating layer 209. After CMP, the copper filling trenches 215 and 218 is flush with the surface of insulating layer 209. Also, after CMP, bonding pad trench 221 is partially filled by copper layer 230 and partially filled with conductive layer 303. Copper layer 230 and conductive layer 303 are flush with the surface of insulating layer 209 if the deposited thickness of conductive layer 303 is sufficient to finish filling the trench 221.

Figure 5:
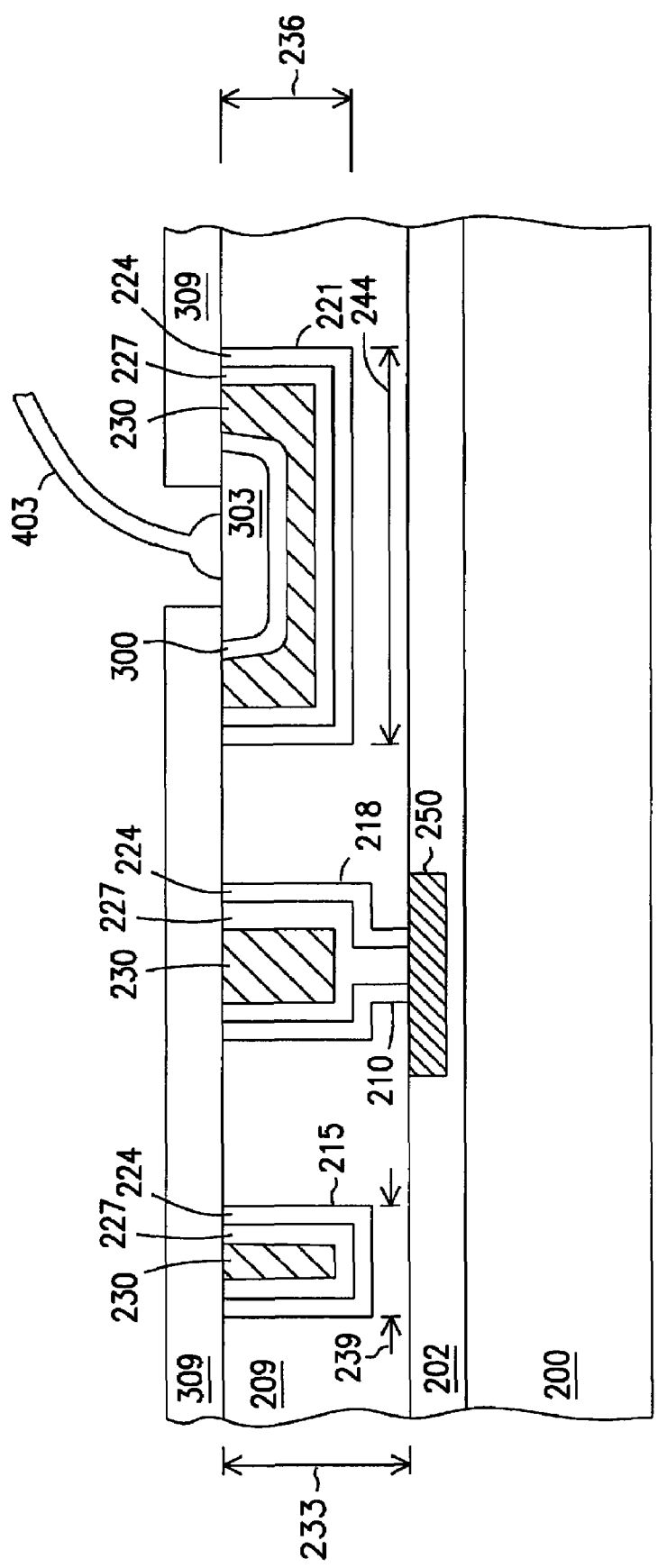
FIG. 5 is a cross-sectional side view of a substrate after opening holes in the passivation and wire bonding.

After chemical mechanical polishing of the metal stack layers 224, 227, 230, 300, 303, in one embodiment, a passivation layer 309 is deposited. This passivation layer may be oxide, nitride, oxide/nitride, nitride/oxide/nitride, polyimide, or any combination. The passivation layer is patterned and etched to create openings in the bond pad trench 221 exposing the conductive layer 303 as shown in FIG. 5. Wire bonds are then attached to conductive layer 303 through the openings in the passivation as shown in FIG. 5. In one embodiment, conductive layer 303 is a material that easily and reliably bonds with gold, such as aluminum or an aluminum copper alloy containing about one-half percent copper. Gold conductor 403 is wire-bonded to bonding material 400 to couple the bonding pad formed in trench 221 to an external connector.

In summary, given a metallization stack of n layers, each with bottom thickness $t_{b1}, t_{b2}, t_{b3}, \ldots, t_{bn}$ and each with sidewall thickness $t_{s1}, t_{s2}, t_{s3}, \ldots t_{sn}$, so long as the trench depth is greater than the $$\text{critical depth} = \sum_{i=1}^{n-1} t_{bi}$$

then the number of layers in the metal stack in each trench will depend on the trench width. For example, for a metallization stack comprised of only metal layers and for trenches having a width<$2t_{s1}$, the trench will be completely filled with a first metal. For trenches having $2t_{s1}$<width<$2(t_{s1}+2t_{s2})$, the trench will contain a first metal layer and a second metal layer, but not any subsequently deposited metal layers. In this way, a plurality of trenches are easily formed with different metallizations programmed by defining the trench width.

An advantage of local multilayered metallization in bond pad trench 221 is that reliable wire-bonding using current state-of-the-art wire-bonding processes is enabled without adding masking steps to the integrated circuit manufacturing process.

Figure 6:
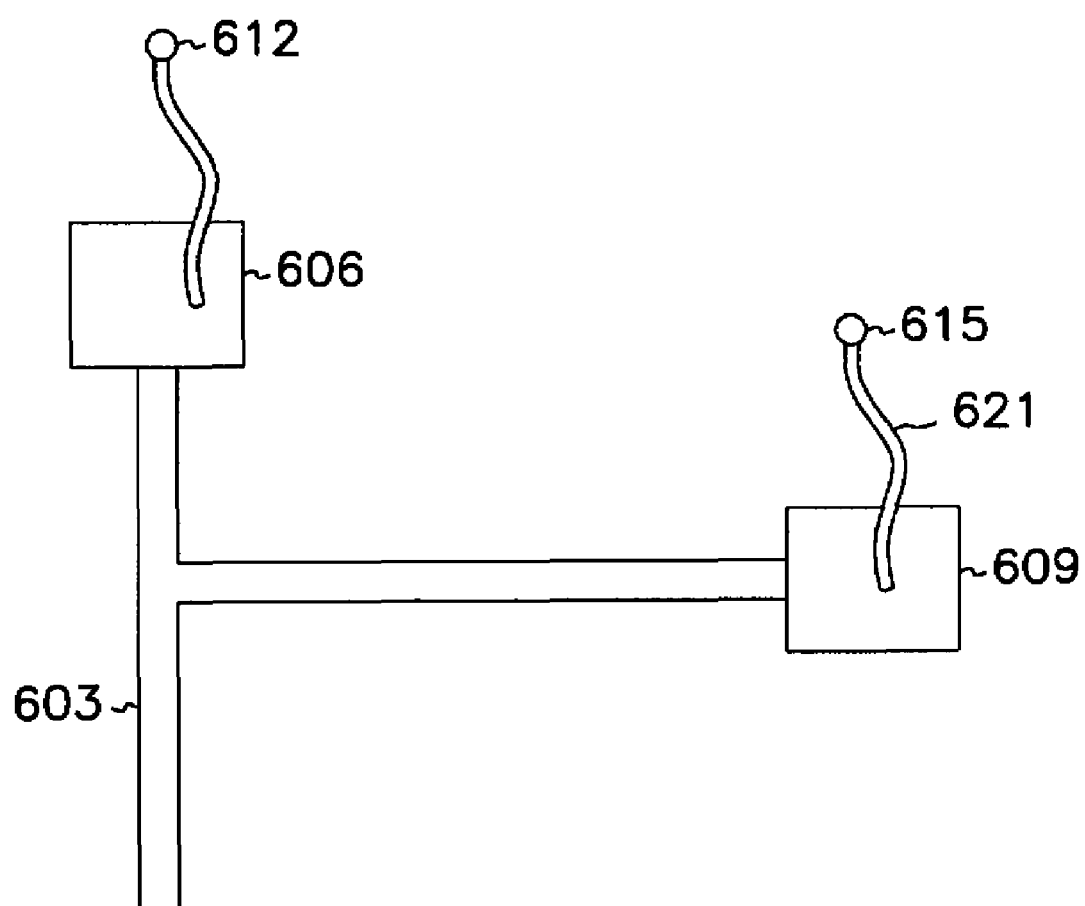
FIG. 6 is a top view of fine lines and wide lines coupled together.

FIG. 6 is a top view of fine line 603 coupled to wide lines 606 and 609. In one embodiment, fine line 603 is a signal carrying line and wide lines 606 and 609 are bonding pads for coupling signal carrying line 603 to off chip connectors 612 and 615. Off chip connector 612 is coupled to wide line 606 by conductive wire 618, and off chip connecter 615 is coupled to wide line 609 by conductive wire 621. Conductive wires 618 and 621 are fabricated from a conductor such as gold, and are coupled to wide lines 606 and 609 using wire-bonding techniques. In one embodiment, wide lines 606 and 609 have a surface layer of aluminum or an aluminum-copper alloy. The bond formed between the aluminum gold wire or between the aluminum-copper alloy and the gold wire is more reliable and stronger than a wire bond between gold and copper. The process for the fabrication of fine line 603 and wide lines 606 and 609 is described above.

Figure 7:
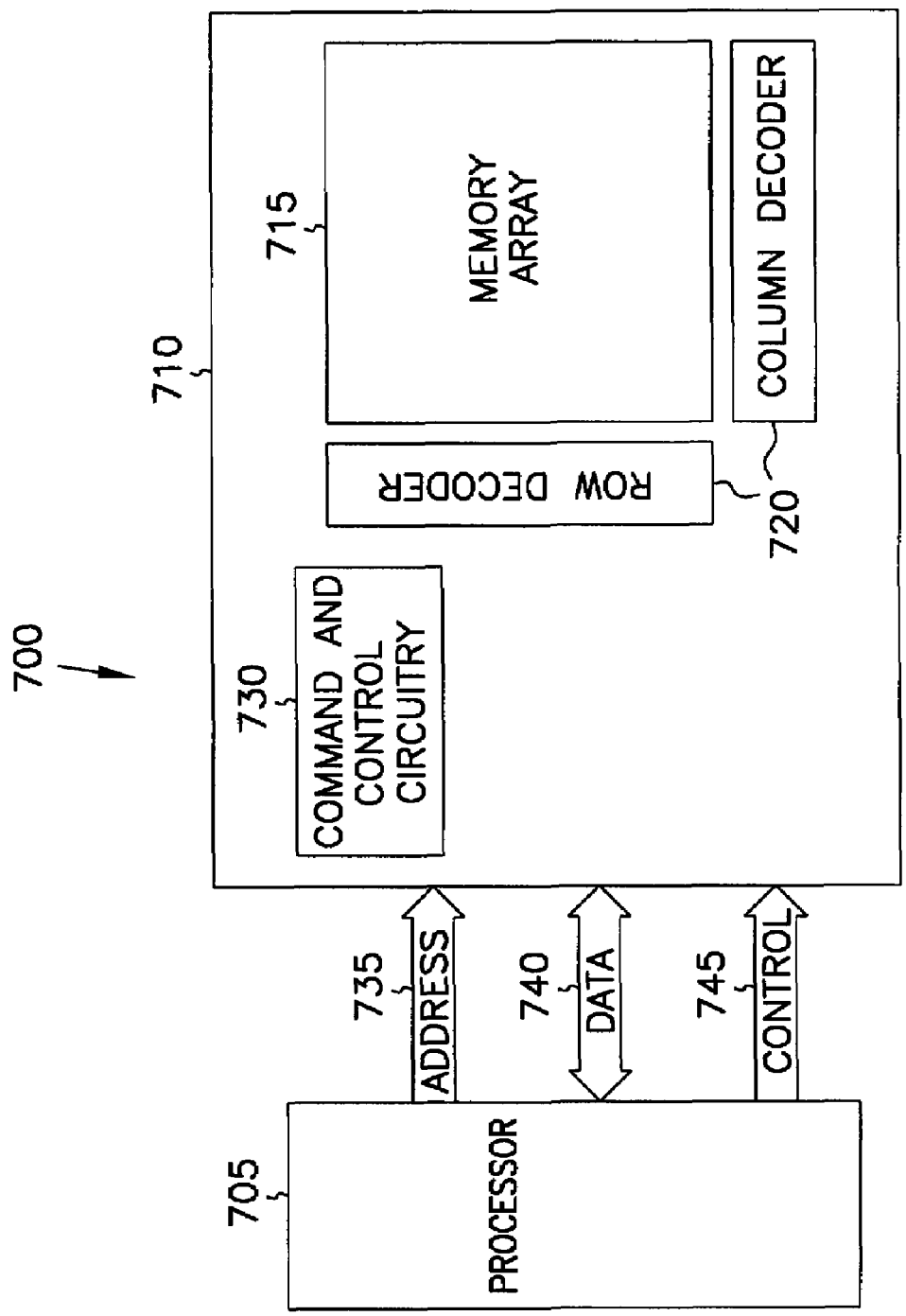
FIG. 7 a block diagram of a computer system suitable for use in connection with the present invention.

FIG. 7 a block diagram of a computer system 700 suitable for use in connection with the present invention. System 700 comprises processor 705 and memory device 710, which includes conductive structures and interconnects of one or more of the types described above in conjunction with FIGS. 1–6. The conductive structures and interconnects of the present invention are capable of coupling logic cells, logic devices, and integrated circuits commonly found in processor 705, such as a microprocessor, a reduced instruction set processor, or a parallel processor. The conductive structures and interconnects of the present invention are also capable of coupling memory devices, memory cells, and integrated circuit memories commonly found in memory device 710. Memory device 710 comprises memory array 715, address circuitry 720, and read circuitry 730, and is coupled to processor 705 by address bus 735, data bus 740, and control bus 745. Processor 705, through address bus 735, data bus 740, and control bus 745 communicates with memory device 710. In a read operation initiated by processor 705, address information, data information, and control information are provided to memory device 710 through busses 735, 740, and 745. This information is decoded by addressing circuitry 720, including a row decoder and a column decoder, and read circuitry 730. Successful completion of the read operation results in information from memory array 715 being communicated to processor 705 over data bus 740.

CONCLUSION

Several embodiments of a conductive structure and methods suitable for use with copper interconnects and state-of-the-art wire bonding systems have been described. These embodiments permit highly reliable wire-bonding connections between chip bond pads and package interconnects. Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A method for forming an interconnect comprising:
   selecting an insulative surface;
   selecting a number of metallization stack layers having a critical thickness;
   etching a first trench on the insulative surface to a first depth greater than the critical thickness and a width less than a sidewall thickness of a first metallization stack, and the trench to couple a first memory cell to a second memory cell;
   etching a second trench on the insulative surface to a second depth greater than the critical thickness and a width greater than the sidewall thickness of the first metallization stack and less than a second sidewall thickness of a second metallization stack;
   depositing the first metal layer;
   depositing the second metal layer; and
   planarizing the insulative surface.

2. The method of claim 1, wherein depositing a first metal comprises depositing copper.

3. The method of claim 1, wherein planarizing the insulative surface comprises planarizing by chemical mechanical polishing.

4. A method for dimensioning a trench comprising:
   selecting a number of layers, the number of layers having a sidewall thickness;
   selecting a second number of layers having a second sidewall thickness, wherein the second number of layers has one less metal layer than the number of layers;
   identifying a critical depth; and
   dimensioning the trench to have a depth greater than the critical depth and a width less than the sidewall thickness but greater than the second sidewall thickness.

5. The method of claim 4, wherein identifying a critical depth comprises:
   calculating a total bottom thickness for one less layer than the number of layers, the total bottom thickness being the critical depth.

6. A method of forming a conductive structure comprising:
   etching a trench having a depth greater than a critical depth in a substrate having a surface, wherein the critical depth is determined by solving the equation $$\text{critical depth} = \sum_{i=1}^{n-1} t_{bi}$$

where $t_{b1}$, $t_{b2}$, $t_{b3}$, . . . , $t_{bn-1}$ respectively represent a thickness of a corresponding layer in a metallization stack with "n" layers;
   under filling the trench with a first conductive material;
   overfilling the trench with a second conductive material suitable for high reliability wire-bonding; and
   polishing the substrate until the first conductive material and the second conductive material are removed from the surface of the substrate.

7. The method of claim 6, wherein polishing the substrate until the first conductive material and the second conductive material are removed from the surface of the substrate comprises:
   applying chemical mechanical polishing to remove the first conductive material and the second conductive material from the surface of the substrate.

8. A method of forming a conductive structure comprising:
   etching a fine line trench to a depth greater than a critical depth in a substrate having a surface;
   etching a wide line trench to the depth in the substrate such that the wide line trench intersects the fine line trench;
   filling the fine line trench with a first conductive material;
   under filling the wide line trench with the first conductive material;
   filling the wide line trench with a second conductive material suitable for high reliability wire-bonding; and
   polishing the substrate until the first conductive material and the second conductive material are removed from the surface of the substrate.

9. The method of claim 8, wherein filling the fine line trench with a first conductive material comprises:
   overfilling the fine line trench with a first conductive material.

10. The method of claim 8, wherein filling the wide line trench with a second conductive material suitable for high reliability wire-bonding comprises:
    under filling the wide line trench with a second conductive material suitable for high reliability wire-bonding.

11. A method of forming a conductive structure comprising:
    etching a wide line trench having a depth greater than a critical depth in the substrate;
    depositing a seed layer above the surface of the substrate;
    depositing a layer of conductive material above the seed layer such that the conductive material under fills the wide line trench;
    depositing a barrier layer above the layer of conductive material;
    depositing a second layer of conductive material above the baffler layer, the second layer of conductive material is capable of reliably wire bonding to a gold wire; and
    removing the seed layer, the layer of conductive material, the baffler layer, and the second layer of conductive material from the surface of the substrate.

12. The method of claim 11, wherein depositing a layer of conductive material above the seed layer such that the conductive material under fills the wide line trench comprises:
    electroplating a layer of copper above the seed layer such that the copper under fills the wide line trench.

13. The method of claim 11, wherein depositing a second layer of conductive material above the barrier layer, the second layer of conductive material is capable of reliably wire bonding to a gold wire comprises:

depositing a layer of aluminum above the barrier layer, the aluminum layer is capable of reliably wire bonding to a gold wire.

14. A method for forming an interconnect comprising:
selecting an insulative surface;
selecting a number of metallization stack layers having a critical thickness;
etching a first trench on the insulative surface to depth greater than the critical thickness and a width less than a sidewall thickness of a first metallization stack;
etching a second trench on the insulative surface to a depth greater than the critical thickness and a width greater than the sidewall thickness of the first metallization stack and less than a second sidewall thickness of a second metallization stack;
depositing the first metal layer;
depositing the second metal layer;
planarizing the insulative surface;
depositing a passivation layer above the insulative surface, the passivation layer covering the trench and the second trench;
etching the passivation layer to form an opening in the passivation layer, the opening to expose the second metal layer in the second trench; and
attaching a wire bond to the exposed second metal layer through the opening in the passivation.

15. The method of claim 14, wherein depositing the second metal layer comprises depositing a barrier layer and depositing aluminum on the barrier layer.

16. A method for dimensioning a trench comprising:
selecting a number of layers, the number of layers having a sidewall thickness including a sidewall seed thickness and a sidewall copper thickness;
selecting a second number of layers having a second sidewall thickness, wherein the second number of layers has one less metal layer than the number of layers;
identifying a critical depth; and
dimensioning the trench to have a depth greater than the critical depth and a width less than the sidewall thickness but greater than the second sidewall thickness.

17. The method of claim 16, wherein the sidewall thickness further includes a sidewall barrier thickness.

18. A method of forming a conductive structure comprising:
etching a trench having a depth greater than a critical depth in a substrate having a surface;
under filling the trench with a first barrier layer, a seed, layer and a first conductive material and a second barrier layer;
overfilling the trench with a second conductive material suitable for high reliability wire-bonding; and
polishing the substrate until the first barrier layer, the seed layer, the first conductive material, the second barrier layer, and the second conductive material are removed from the surface of the substrate.

19. The method of claim 18, wherein the critical depth includes a summation of a vertical first barrier thickness, a vertical seed thickness, a vertical first conductive material thickness, and a vertical second barrier thickness.

20. A method of forming a conductive structure comprising:
etching a fine line trench to a depth greater than a critical depth in a substrate having a surface;
etching a wide line trench to the depth in the substrate such that the wide line trench intersects the fine line trench;
filling the fine line trench with a first conductive material;
under filling the wide line trench with the first conductive material;
filling the wide line trench with a second conductive material suitable for high reliability wire-bonding;
polishing the substrate until the first conductive material and the second conductive material are removed from the surface of the substrate; and
coupling the second conductive material to an off chip connector by a conductive wire.

21. The method of claim 20, wherein the second conductive material is aluminum and the conductive wire is gold.

22. A method of forming a conductive structure comprising:
depositing an insulating layer above a substrate;
etching a wide line trench having a depth greater than a critical depth in the insulating layer;
depositing a seed layer above the surface of the insulating layer;
depositing a layer of conductive material above the seed layer such that the conductive material under fills the wide line trench;
depositing a barrier layer above the layer of conductive material;
depositing a second layer of conductive material above the barrier layer, the second layer of conductive material is capable of reliably wire bonding to a gold wire; and
removing the seed layer, the layer of conductive material, the barrier layer, and the second layer of conductive material from the surface of the insulative layer.

23. The method of claim 22, wherein the depth of the wide line trench is less than a final thickness of the insulating layer.

24. A method of forming a conductive structure comprising:
etching a wide line trench having a depth greater than a critical depth in the substrate;
depositing a first barrier layer above the surface of the substrate;
depositing a seed layer on the first barrier layer;
depositing a layer of conductive material above the seed layer such that the conductive material under fills the wide line trench;
depositing a second baffler layer above the layer of conductive material;
depositing a second layer of conductive material above the second baffler layer, the second layer of conductive material is capable of reliably wire bonding to a gold wire; and
removing the first baffler layer, the seed layer, the layer of conductive material, the second baffler layer, and the second layer of conductive material from the surface of the substrate.

25. A method of forming a conductive structure comprising:
etching a wide line trench having a depth greater than a critical depth in the substrate;
depositing a seed layer above the surface of the substrate;
depositing a layer of conductive material above the seed layer such that the conductive material under fills the wide line trench;
depositing a baffler layer above the layer of conductive material;
depositing a second layer of conductive material above the baffler layer, the second layer of conductive material is capable of reliably wire bonding to a gold wire;

removing the seed layer, the layer of conductive material, the baffler layer, and the second layer of conductive material from the surface of the substrate;

depositing a passivation layer above the substrate surface, the passivation layer covering the wide line trench;

etching the passivation layer to expose the second layer of conductive material; and attaching the wire to the exposed second layer of conductive material through an opening in the passivation.

26. The method of claim 21, wherein the wide line trench has a depth less than or equal to the critical depth.

* * * * *

UNITED STATES PATENT AND TRADEMARK OFFICE
CERTIFICATE OF CORRECTION

PATENT NO.       : 7,375,026 B2
APPLICATION NO.  : 10/931357
DATED            : May 20, 2008
INVENTOR(S)      : Rhodes It is certified that error appears in the above-identified patent and that said Letters Patent is hereby corrected as shown below:

On the face page, in field (56), under "Other Publications", in column 2, line 1, delete "Feb. 2, 2007" and insert -- Feb. 8, 2007 --, therefor.

In column 8, line 1, in Claim 6, after "where" insert -- , --.

In column 8, line 52, in Claim 11, delete "baffler" and insert -- barrier --, therefor.

In column 8, line 56, in Claim 11, delete "baffler" and insert -- barrier --, therefor.

In column 10, line 45, in Claim 24, delete "baffler" and insert -- barrier --, therefor.

In column 10, line 48, in Claim 24, delete "baffler" and insert -- barrier --, therefor.

In column 10, line 51, in Claim 24, delete "baffler" and insert -- barrier --, therefor.

In column 10, line 52, in Claim 24, delete "baffler" and insert -- barrier --, therefor.

In column 10, line 63, in Claim 25, delete "baffler" and insert -- barrier --, therefor.

In column 10, line 66, in Claim 25, delete "baffler" and insert -- barrier --, therefor.

In column 11, line 2, in Claim 25, delete "baffler" and insert -- barrier --, therefor.

Signed and Sealed this

Twenty-sixth Day of August, 2008

JON W. DUDAS
*Director of the United States Patent and Trademark Office*